United States Patent [19]

Fleming

[11] 3,715,607

[45] Feb. 6, 1973

[54] ELECTROLUMINESCENT CIRCUIT OR THE LIKE

[75] Inventor: Gordon R. Fleming, Pontiac, Mich.

[73] Assignee: Energy Conversion Devices, Inc., Troy, Mich.

[22] Filed: March 4, 1971

[21] Appl. No.: 120,827

Related U.S. Application Data

[63] Continuation-in-part of Ser. No. 825,153, May 16, 1969.

[52] U.S. Cl. ..................307/287, 307/272, 307/311, 317/234 V

[51] Int. Cl. ..............................................H03k 3/31

[58] Field of Search......307/278, 286, 287, 272, 311; 317/234 V

[56] References Cited

UNITED STATES PATENTS

| | | | |
|---|---|---|---|
| 3,206,618 | 9/1965 | Kallmann | 307/287 |
| 3,557,346 | 1/1971 | Lomax | 307/286 X |
| 3,573,757 | 4/1971 | Adams | 317/235 V |

*Primary Examiner*—John Zazworsky
*Attorney*—Edward G. Fiorito and Wallenstein, Spangenberg, Hattis & Strampel

[57] ABSTRACT

A circuit arrangement rapidly triggering a light-emitting and control bistable circuit into stable ON and OFF states while operating potential is continuously applied to the selective circuit to provide light emitting and de-energized states. A light-emitting element or an element added in series therewith acts as a capacitor. The light-emitting and capacitive elements are connected in series with a threshold switching device having inherent time delay characteristics, and connected at the circuit juncture between the light-emitting and capacitive elements and the threshold switching device is a start and stop circuit preferably with isolation means for selectively applying start and stop pulses to charge the capacitor while bypassing the threshold switching device to initiate operation of the circuit during one instance, and to discharge the energy stored in the capacitive element to terminate operation of the circuit during another instance. A display array of rows and columns of such bistable circuits is formed with mean for energizing selectively desired start and stop circuits associated with selective bistable circuits independently of the threshold switching devices used in the circuits and for providing means, independent of the operating potential lines, for addressing selected ones of the electroluminescent circuits within an array.

10 Claims, 6 Drawing Figures

Inventor
Gordon R. Fleming
By: Wallenstein, Spangenberg, Hattis & Strampel attys

ELECTROLUMINESCENT CIRCUIT OR THE LIKE

This application is a continuation-in-part application of application Ser. No. 825,153 filed May 16, 1969.

This invention has its most important application in display systems and the like, such as electroluminescent display systems, for the display of visual information, although some aspects of the invention have application to information storage generally where visual display of the information is not required. Specifically, this invention is directed to information storage or display systems using time delay acting threshold switch means and capacitive means forming a bistable circuit at each display or storage point operable between stable ON and OFF conditions and means for applying turn-on and turn-off signals which are rapidly effective in activating each selected bistable circuit between the stable ON and stable OFF conditions.

The electroluminescent circuit application of this invention can be used either as a single circuit arrangement selectively to energize a single electroluminescent element of most any desired configuration or a plurality of such electroluminescent circuits may be used in an electroluminescent array selectively to form thereon any desired visual display pattern capable of being displayed by the particular arrangement of the electroluminescent array. The electroluminescent element acts as a capacitor in the circuit in that it provides capacitive energy string characteristics, and in response to the conductive condition of a threshold switching device connected in series therewith, is charged, discharged and then recharged to an opposite polarity during operation of the electroluminescent circuit while in the stable ON condition. Connected in circuit with the electroluminescent element is a threshold switch means or device which, preferably, has an initial or normal threshold voltage value greater than the peak value of the continuously applied operating potential and, therefore, the voltage across the threshold switch means, while the electroluminescent element is uncharged will not be sufficient to overcome the normal threshold voltage value to render it conductive, so the electroluminescent circuit will remain in a stable OFF condition. On the other hand, should a voltage charge of proper polarity be applied to the capacitive electroluminescent element through a low time constant circuit which bypasses the relatively slower operating threshold switching device, an extremely fast turn-on of the circuit can be effected as this voltage charge combines or adds with a voltage pulse of opposite polarity from the continuously applied operating potential, which is an alternating current voltage (but in some instances it may be a direct current voltage), to apply across the threshold switching device a voltage greater than the threshold voltage value thereof to render the threshold switching device conductive and discharge the electroluminescent element of its previous charge and recharge the electroluminescent element to a voltage and polarity of the applied voltage. This action of discharging and recharging the electroluminescent element will occur for each half cycle where the applied voltage is an alternating current voltage of the applied voltage and the electroluminescent circuit will be in its stable ON condition to emit light continuously from the electroluminescent element because each half cycle the new charge on the electroluminescent element will add to the applied voltage to exceed the threshold voltage value of the threshold switch device. The electroluminescent circuit is returned to its stable OFF condition by discharging the electroluminescent element at the proper time.

Where a plurality of the above described electroluminescent circuits are used to form an electroluminescent array it becomes necessary to provide means selectively to address desired portions of the array with suitable isolated start and stop electroluminescent element charging and discharging pulses while operating potential is applied thereto, whereby to operate certain ones of the electroluminescent circuits between stable ON and stable OFF conditions, or vice versa. Threshold switching devices, or other similar current controlling switching devices have inherent time delay characteristics between the time a switching voltage is applied thereto and the time the device actually is rendered conductive, and so it becomes necessary to compensate for such inherent time delay characteristics by applying to the array start and stop address pulses which have a sufficient time duration to ensure that a switching device of a particular electroluminescent circuit will be rendered conductive to place the selected electroluminescent circuit in either its stable ON or stable OFF condition. This inherent time delay of such switching devices greatly limits the speed at which electroluminescent arrays can be addressed to form display pattern where the start and stop pulses are applied through such devices rather than through circuits which bypass the same, as in the case of the array described above. Each aforesaid threshold switching device bypassing circuit most advantageously includes suitable isolating means like a diode which is forwardly biased by short duration address signals quickly to store or remove energy from the electroluminescent element acting as a capacitor in time intervals far less than the inherent time delay of the active switching devices used in the electroluminescent circuit. The electroluminescent circuits of this invention may be used in many different forms of electroluminescent arrays to sequentially or randomly display indicia or other visual information from relatively flat and thin electroluminescent display screens. In one arrangement, the display screen may comprise a plurality of parallel spaced apart visually transparent electrodes over which discrete element of electroluminescent material may be deposited to make electrical connection with the transparent electrodes. The other components of the electroluminescent circuit are then formed or connected to the rear surface of the electroluminescent material or adjacent thereto and a second group of parallel spaced apart electrodes are provided for connection to certain ones of the electroluminescent circuits, preferably the electrodes being arranged in a cross-grid X-Y arrangement such that the nonconnected crossings of the X-Y electrodes provide junctures across which electroluminescent circuits are connected. Address signals are then applied to selected electrodes to gain access to the electroluminescent circuit at the juncture of any two electrodes to energize the circuit. Where the isolation means of each electroluminescent circuit is a diode, it is preferably initially reversed biased to isolate the diode circuit from the circuit including the threshold switching device, the electroluminescent element and the source of operating potential.

The threshold switching devices used in this invention are preferably one-layer type threshold semiconductor devices each having substantially identical conduction characteristics for positive and negative applied voltages, but which may be slightly different threshold voltage values with respect to one another. The threshold switching devices initially present a very high resistance in response to an applied voltage of either polarity below the threshold voltage value thereof and a very low resistance in response to an applied voltage of either polarity above the threshold voltage value thereof, the change from the high to the low resistance condition occurring after an inherent time delay of the switching devices but once switching begins it is substantially instantaneous. The threshold semiconductor switching devices automatically reset themselves to their high resistance state when the current therethrough drops below a minimum holding current value which is near zero. The threshold switching devices have a substantially reduced threshold voltage value immediately after they are rendered non-conductive, and after a relatively short recovery time delay, during which the threshold voltage value progressively increases, the normal initial threshold voltage value is again reached. Semiconductor materials used to form such threshold switching devices most advantageously are of the type disclosed in U.S. Pat. No. 3,271,591 issued to Stanford R. Ovshinksy on Sept. 6, 1966 and sometimes referred to therein as "mechanism devices without memory." By varying the semiconductor composition or the treatment of the material disclosed in the above mentioned patent, the upper and lower threshold voltage values and the blocking or leakage resistance thereof are readily varied to obtain the desired rang of conditions necessary for proper operation of electroluminescent arrays constructed in accordance with this invention. Blocking resistance values of the order of one to ten megohms and higher are readily obtainable, as well as somewhat lower blocking resistance values. The time delay between the time a threshold voltage is applied to the threshold switching device and the time the threshold switching device actually changes from its high resistance blocking condition to its low resistance conducting condition varies with the degree which the amplitude of the applied voltage exceeds the threshold voltage value of the particular devices involved, an increase in applied voltage from the threshold voltage value to a greater value causing a decrease in the turn-on time delay. If a voltage pulse having an amplitude equal to or greater than the normal threshold voltage value of the switching devices involved is applied thereto for a period of time less than the inherent time delay corresponding to that particular voltage amplitude, the threshold switching device will not be rendered conductive. Also, if an operating potential of alternating current voltage is applied to the threshold switching devices used in this invention at a sufficiently high frequency so that the portion of the periodic pulses which exceed the threshold voltage value has a duration much less than the inherent time delay corresponding to the amplitude of the applied voltage, then a voltage value in excess of the threshold voltage value of these switching devices may be applied thereto without rendering these switching devices conductive. Therefore, when a multiple of such threshold switching devices are incorporated in an electroluminescent display array, the threshold voltage values of these devices need not be the same, and in fact, some or all of the threshold switching devices can have a threshold voltage value less than the amplitude of the applied voltage without causing erratic operating of the display array.

Because of the aforesaid temporary diminished threshold voltage value after the switching devices are turned off, if a voltage is applied to any one of the threshold switching devices within the recovery time delay period it is rendered nonconductive, this pulse need only have an amplitude equal to the then existing threshold voltage value to again render the switching device conductive. If the operating potential applied to the switching devices is an alternating current voltage of sufficiently high frequency so that each successive periodic pulse of the applied potential will reoccur within the inherent time delay for full recovery of the switching devices, and each pulse exceeds the reduced threshold voltage value of the switching device for a given period which can render the device conductive, these switching devices can be continually rendered conductive on each half cycle of the applied voltage even if the total voltage applied thereto is substantially below the normal threshold voltage value of the switching devices involved.

Many objects, features and advantages of this invention will be more fully realized and understood from the following detailed description when taken in conjunction with the accompanying drawings wherein like reference numerals throughout the various views of the drawings are intended to designate similar elements or components.

Figures 1, 2, 3, 4, 5, 6:
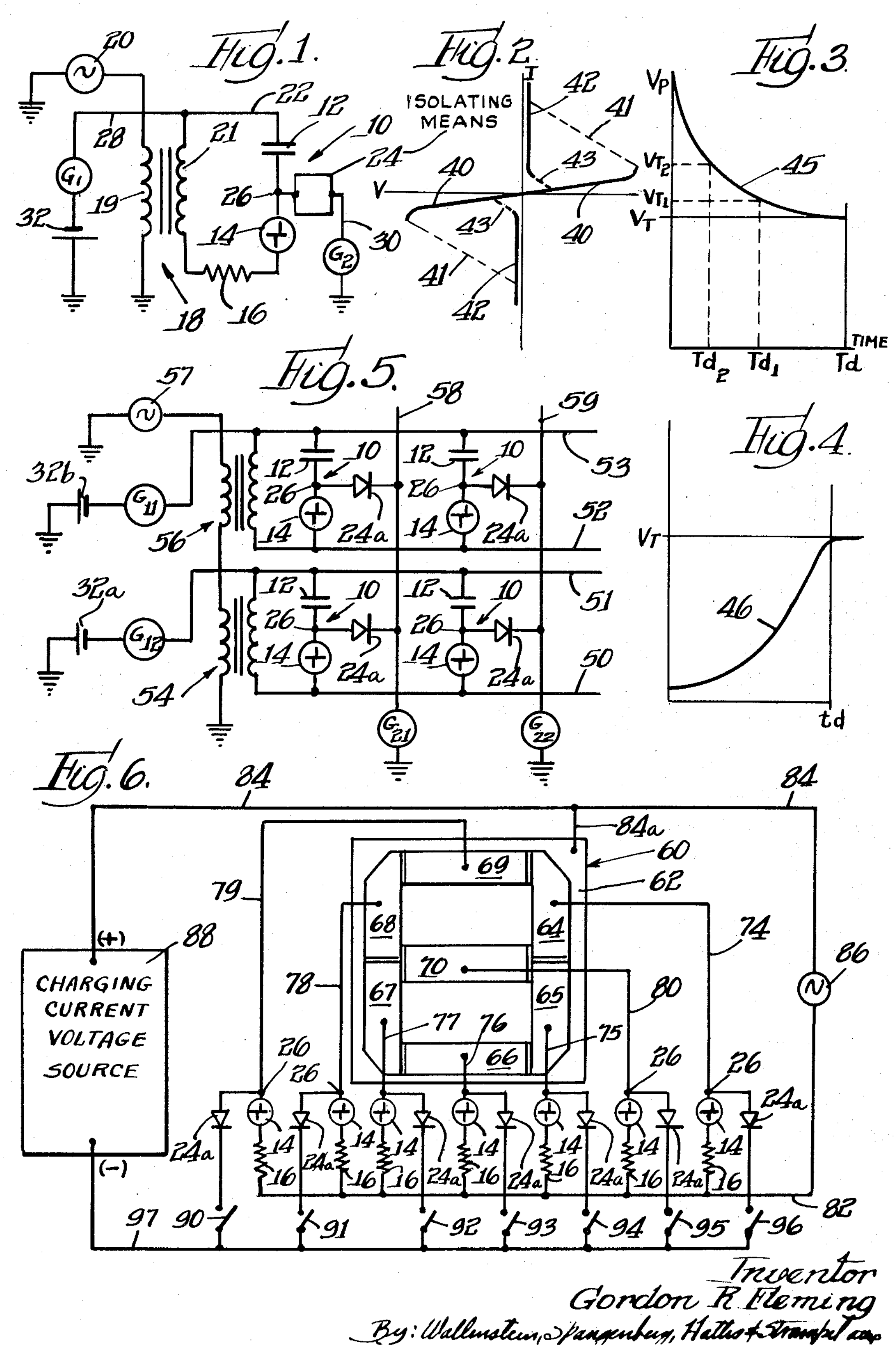
FIG. 1 illustrates a simplified circuit diagram of an electroluminescent circuit with isolation means connected thereto in accordance with this invention.
FIG. 2 illustrates the I–V characteristic of the threshold switching device used in this invention.
FIG. 3 illustrates the inherent turn-on time delay characteristic of the threshold switching device used in this invention.
FIG. 4 illustrates the inherent recovery time delay characteristic of the threshold switching device used in this invention.
FIG. 5 illustrates an array formed by using a plurality of electroluminescent circuits of FIG. 1 wherein the isolation means is a diode.
FIG. 6 illustrates a simplified electroluminescent display array formed by using a plurality of the electroluminescent circuits with isolation as shown in FIG. 1 and wherein the discrete areas of electroluminescent material can form numerals.

Referring now to FIG. 1 there is seen a simplified circuit arrangement illustrating a bistable circuit constructed in accordance with the principles of this invention and designated generally by reference numeral 10. The bistable circuit 10 includes a capacitive energy storage circuit element 12 which, most advantageously, is an electroluminescent element which acts as a capacitor in the circuit and which emits light as the result of changing voltages applied thereto. (However, without departing from the novel concepts of this invention, it will be understood that a non-light emitting capacitive element 12 can be used in the circuit where information storage rather then visual display of information is desired, and where information display is desired the capacitive light emitting element 12 could less desirably be replaced by a capacitor in series with a non-capacitive light emitting element like an incandescent lamp.) Connected in circuit with the capacitive energy storage element 12 is a threshold switch means 14 which, preferably, is a bidirectional threshold switching device having a predetermined threshold voltage value. Although the exemplary circuit arrangement shown herein illustrates the capacitive circuit element 12 and the threshold switch means connected in series, it will be understood that other circuit arrangements of these components may be made without departing from this invention. A resistor element 16 is preferably connected in circuit with the capacitive element 12 and threshold switch means 14, the resistance element 16 being either a discrete circuit component or formed by inherent circuit resistance. To apply an operating potential across the bistable circuit 10 there is provided a transformer 18 which has a primary winding 19 thereof connected to an alternating current voltage source 20 and a secondary winding 21 for applying the operating potential to the electroluminescent circuit 10 via the resistance element 16 and a circuit line 22. The peak voltage amplitude of the operating potential applied across the capacitive element 12 and threshold switch means 14 is preferably maintained below the initial or normal threshold voltage value of the threshold switch means 14, and, therefore, no current will initially flow through the bistable circuit 10 to charge the capacitive element 12.

In accordance with one aspect of this invention, an isolation means 24 is connected to circuit point 26 between the capacitive element 12 and the threshold switch means 14 for applying address signal information, such as, for example, very short time duration address pulse signal information, to the circuit point 26, thereby placing a charge of electrical potential on the capacitive element 12 which is required to initiate operation of the bistable circuit 10. As the threshold switch means is still in its high resistance blocking condition the charge on the capacitive element 12 remains substantially constant or leaks off very slowly, for a period of time until one half cycle of the alternating current voltage is of a polarity to add with the charge on the capacitive element 12 thereto to provide a resultant switching potential across the threshold switching means 14 equal to or greater than its initial or normal threshold voltage value. During each half cycle of the operating potential , the combined switching potential, (i.e. the operating potential plus the charge on the capacitive element 12) remains for a period of time at least equal to the inherent turn-on time delay of the threshold switching device 14 ultimately to render it conductive. This action will discharge the capacitive element 12 from its previously charged condition and recharge the capacitive element to the polarity of the particular half cycle involved. The next half cycle of operating potential will then add with the now existing charge on the capacitive element 12 and add therewith to again render the threshold switch means 14 conductive, and this action will repeat itself for each cycle to maintain the bistable circuit 10 in its stable ON condition continually charging and discharging the capacitive element 12 without further need of pulse signal information at the circuit juncture 26. When the capacitive element 12 is an electroluminescent element, light will be emitted during the stable ON condition of the bistable circuit 10.

To return the bistable circuit 10 back to its stable OFF condition, e.g. extinguish luminescence when the capacitive element 12 is an electroluminescent element, an address signal pulse is fed through the isolation means 24 at some point in time after one of the normal operating cycles has just charged the capacitive element 12. This address signal pulse will discharge the present charge on the capacitive element 12 substantially completely or at least to a sufficiently low potential, or charge the same to a potential of opposite polarity, so that the new half cycle of the operating potential will have no affect on the circuit and the bistable circuit 10 will be returned to its stable OFF condition.

The advantageous result obtained by operating a bistable circuit in this manner is that when many such bistable circuits are formed into a matrix array, the matrix can be addressed at speeds greater than could be obtained when triggering the threshold switch device 12 directly with the address signal pulse. That is, direct application of address signals to the threshold switching device 14 are required to remain on the device for a time equal to the inherent turn on time delay of the device.

Address signal pulses are preferably generated by pulse generators $G_1$ and $G_2$ which provide synchronized pulses of opposite polarity relative to the indicated ground to energize the bistable circuit 10. However, in a single circuit arrangement, as shown in FIG. 1, a single pulse generator may be used rather than two. The pulse generator $G_1$ is connected to the circuit line 22 via a line 28, and the pulse generator $G_2$ is connected to the isolation means 24 via a line 30. In accordance with another aspect of this invention, where the isolation means 24 is a undirectional current flow device, a direct current voltage source 32 preferably is provided to reverse bias the isolation means 24 during all periods of time except when pulse signal information is applied to the circuit to overcome the reverse bias and change the stage of charge on the capacitive element 12. When it is desired to change the condition of operation of the bistable circuit 10 from one stable state to the other stable state, pulse generators $G_1$ and $G_2$ provides current pulses of opposite polarity to charge or discharge the capacitive element 12 as mentioned hereinabove. The use of a diode (see diode 24*a* in FIG. 5) requires that these start and stop pulses provided by generators $G_1$ and $G_2$ be of the same polarity. The timing of the start pulses is not critical although it is preferably applied for its most rapid effect during the half cycle where the charge on the capacitor adds to the voltage then being applied across the winding 21. The stop pulses should be applied at or near the beginning of a half cycle of the operating potential where the capacitive light emitting element will be discharged and preferably recharged to a polarity which is in voltage opposition to the polarity of the operating potential being generated so the resultant voltage applied to the threshold switching device involved will be below the threshold voltage value thereof.

For a better understanding of the threshold switching means preferably used in this invention, reference is now made to FIGS. 2, 3 and 4 which illustrate the various electrical characteristics thereof. The threshold switch means 14 is symmetrical in its operation, it blocking current substantially equally in each direction and conducting current substantially equally in each direction and the switching action between the blocking and conducting condition being extremely rapid after the inherent time delay thereof. FIG. 2 is an I–V curve illustrating the A.C. operation of the threshold switching means 14, it being understood that either the first or third quadrant of the graph will represent the application of a direct current voltage (D.C.). Considering a D.C. voltage applied across the threshold switch means 14, represented by the first quadrant of FIG. 2, the threshold switch means 14 is normally in its high resistance blocking condition, and, as the D.C. voltage is increased the voltage current characteristics of the device are illustrated by the curve 40, the electrical resistance of the switch means being high and substantially blocking current flow therethrough. When the voltage is increased to a threshold voltage value, the high electrical resistance of the threshold switch means substantially instantaneously decreases to a low electrical resistance, the substantially instantaneous switching occuring after the inherent time delay and being indicated by the curve 41. This provides a low electrical resistance conducting condition for conducting current therethrough. The low electrical resistance is many orders of magnitude less than the high electrical resistance. The conducting condition of the switching means 14 is illustrated by the curve 42 and it is noted that there is a substantially linear voltage-current characteristic and a substantially constant voltage characteristic which are the same for increases and decreases in current. In other words, current is conducted at a substantially constant voltage. The low electrical resistance condition of the threshold switch means 14 has a voltage drop which is a minor fraction of the voltage drop in its high electrical resistance blocking condition.

As the voltage is decreased, the current decreases along the curve 42 and when the current decreases below a minimum holding current value, the electrical resistance of the threshold switch means quickly returns to the high electrical resistance, as illustrated by the curve 43, to re-establish the high resistance blocking condition. In other words, a minimum holding current is required to maintain the threshold switch means 14 in its conductive condition and when the current falls below the minimum holding current value the low electrical resistance condition of As the voltage is decreased, the current decreases along the curve 42 and when the current decreases below a minimum holding current value, the electrical resistance of the threshold switch means quickly returns to the high electrical resistance, as illustrated by the curve 43, to re-establish the high resistance blocking condition. In other words, a minimum holding current is required to maintain the threshold switch means 14 in its conductive condition and when the current falls below the minimum holding current value the low electrical resistance condition of the threshold switch 14 immediately returns to the high electrical resistance condition. However, the threshold voltage value of the threshold switch means 14 is substantially reduced immediately after the threshold switching device is rendered non-conductive and the threshold voltage value increases to the normal or initial threshold voltage value after a predetermined recovery time delay. Therefore, after the threshold switch means 14 is rendered non-conductive a lesser applied voltage may again render it conductive when applied thereto within the inherent time delay thereof.

When A.C. is applied to the threshold switch means, the I–V curve is illustrated by quadrants 1 and 3 of FIG. 2. Here the threshold switch means 14 is in its blocking condition when the peak value of the applied alternating current voltage is below the threshold voltage value of the threshold switch means, the blocking condition being illustrated by the curves 40—40 in both quandrants 1 and 3. When, however, a peak value of alternating current voltage increases above the threshold voltage value of the switch means 14, the switch means 14 substantially instantaneously switches along the curves 41—41 to the conducting condition illustrated by the curves 42—42, this switching action occurring during each half cycle of the applied alternating current voltage. As the applied alternating current voltage nears zero so that the current through the threshold switch means 14 falls below the minimum holding current value thereof, the switch means 14 switches along the curves 43—43 from the low electrical resistance condition to the high electrical resistance condition illustrated by the curves 40—40, this switching action occurring near the end of each half cycle of the applied alternating current voltage.

Referring now to FIG. 3 there is illustrated the inherent turn-on time delay characteristic of the threshold switch means 14 where the normal threshold voltage value is indicated at VT, the inherent time delay at the threshold voltage value is indicated at Td and the variation of time delay with respect to the amplitude of the applied voltage is illustrated by the curve 45. When the applied voltage is increased to $VT_1$ the turn-on time delay is decreased to $Td_1$ and when the applied voltage is increased to $VT_2$ the turn-on time delay is decreased to $Td_2$ and so on to a high voltage value VP where the turn-on time delay is reduced substantially to zero. The value of the inherent time delay of the threshold switch means 14 may be altered by, among other things, changing the composition of the semiconductor material used in forming the threshold switch means or by varying the thickness of the layer or film forming the threshold switch means. However, it will be noted that the time delay $T_d$ will decrease with increases of applied voltage between the value $V_T$ and the value $V_P$. Therefore, the time duration of the applied voltage on the threshold switch means 14 need only be as long as the time delay corresponding to the time delay of the voltage value in excess of $V_T$.

FIG. 4 illustrates the inherent recovery time delay $t_d$ of the threshold switch means 14 to recover to its normal threshold voltage value after the threshold switch means is rendered nonconductive, this being indicated by the curve 46. Here it can be seen that immediately after the threshold switch means 14 is rendered nonconductive it will have a substantially reduced threshold voltage value which increases with time until the normal threshold voltage value $V_T$ is again reached, this time delay being readily selected by, among other things, varying the composition of the material used to form the threshold switch means 14. When the threshold switch means 14 is operated by a series of voltage pulses, as for example, alternating current voltage, only the initial voltage pulse need have a voltage amplified and time duration corresponding to the initial normal threshold voltage value and time delay as illustrated in FIG. 3, or a lesser time delay corresponding to the over-voltage of the applied pulse. However, if a subsequent pulse of voltage is applied to the threshold switch means 14 before the threshold voltage value thereof is fully recovered to its normal or initial threshold voltage value, as indicated at $V_T$ in FIG. 4, this subsequent pulse of voltage need only have an amplitude equal to the then existing threshold voltage value illustrated by the curve 46. The turn-on time delay illustrated in FIG. 3 may persist regardless of the time at which a subsequent pulse of voltage is applied to the threshold switch means 14, the only difference being a decrease or shifting of the entire curve 45 with a corresponding decrease in VT, $VT_1$ and $VT_2$. Therefore, once the threshold switch means is rendered conductive, it can be successively rendered conductive by closely spaced pulses (formed by the addition of the voltage on the capacitive element 12 and the operating potential) which have a resultant voltage amplitude less than the initial normal threshold voltage value of the threshold switch means 14. Thus, the amplitude of the start pulses can be greater than the amplitude of the voltage to which the capacitive element 12 is charged by the operating potential after the initial conduction of the threshold switching means 14. However, if the stop pulses render the threshold switch means 14 nonconductive for a time interval td corresponding to the inherent recovery time delay illustrated in FIG. 4, the threshold switch means 14 will fully recover to the normal or initial threshold voltage value and no longer will be rendered conductive as a result of resultant voltages having an amplitude below the normal threshold voltage value of the threshold switch means 14.

When using threshold switch means of the type described hereinabove to form the bistable circuit 10, of FIG. 1, the inherent time delay characteristics of the switch means, if addressed in a conventional manner, will limit the speed at which such bistable circuits can be addressed between their stable ON and stable OFF conditions. However, by utilizing an isolation means in accordance with this invention rapidly to charge and discharge the capacitive element 12, independent of the applied operating potential, address signal information can be applied to the bistable circuit 10 at speeds far greater than would otherwise be possible when taking into account the inherent time delay of the threshold switch means 14. The only substantial limiting factors for the time duration of address pulse signal information applied to the bistable circuit 10 are the RC time constant of the charge path of the capacitive element 12 and the inherent time limitations of the pulse signal generators $G_1$ and $G_2$. When the capacitive element 12 is an electroluminescent element of relatively small area and thickness, the capacitance of the electroluminescent element is in the order of picofarads thus providing a relatively small RC time constant. Also, it will be noted that the resistance element 16, of FIG. 1, is preferably placed in the circuit so as not to be in the charge path of the address pulse signal information passing through the capacitive element 12. Preferably, the frequency of the operating potential applied to the bistable circuit 10 is selected so that the time interval of one half cycle is sufficient to allow the threshold switch means 14 to recover at least to a threshold voltage value above the resultant voltage applied thereto. Therefore, after rapid discharge and/or recharge of the capacitive element 12 by stop pulse signal information from the pulse generators $G_1$ and $G_2$ preferably occurring substantially immediately after a normal recharging cycle thereof, sufficient time is provided to allow the threshold switch means to recover a threshold voltage value greater than the resultant voltage applied thereto.

FIG. 5 illustrates a fragmentary portion of an array of bistable circuits 10 arranged in a cross-grid X-Y matrix, and where the capacitive element 12 is an electroluminescent element, the matrix is capable of developing visual display patterns, such as for example, graphs, letters, numbers or rapidly changing video signal information such as a television picture. A plurality of pairs of spaced apart electrodes 50, 51, 52 and 53 are provided for applying operating potential to the bistable circuits 10 by means of power transformers 54 and 56 connected to an alternating current voltage source 57. The pairs of lines 50, 51 and 52, 53 may be energized sequentially or simultaneously, and with operating potential applied thereto the bistable circuits 10 will be selectively operated between stable ON and stable OFF conditions. When operating potential is sequentially applied to the pairs of lines 50, 51 and 52, 53 while selected bistable electroluminescent circuits along each pair of lines are energized to emit different amounts of light therefrom to simulate the sequential line scanning of a television system, rapidly changing video signals may be displayed on the array of FIG. 5. A pair of vertical electrodes 58 and 59 are provided for receiving address signal information from signal generators $G_{21}$ and $G_{22}$ selectively to initiate energization of any selected one of the bistable circuits 10. Here the isolation means 24 is illustrated as a diode 24a having its anode connected to the circuit point 26 and its cathode connected to its associated address signal line 58 or 59. One advantage obtained by using isolation means in accordance with this invention is that operating potential can be applied to the bistable circuits by independent lines while address signal information is applied to the matrix by separate lines which may or may not include one line common with the operating potential lines. To insure that only the elected bistable circuits at the crossing of the selected horizontal and vertical address lines is energized or de-energized while other bistable circuits along these lines will remain unchanged, the address signal information is divided between the pulse generators $G_{21}$, $G_{22}$ and a pair of pulse generators $G_{11}$ and $G_{12}$. A half select signal is applied to the selected row and column address lines and are combined or added together at the selected juncture to provide an address signal of sufficient amplitude to energize the bistable circuit at that juncture. The half select signals are maintained sufficiently low so as not to effect a change in operation of the non-selected bistable circuits 10 along a given row or given column and only the bistable circuit at the juncture of the selected row and column circuit line will be energized or de-energized, whichever the case may be. For example, the pulse generator $G_{12}$ will provide a positive address pulse while simultaneously the pulse generator $G_{21}$ will provide a negative address pulse thereby forward biasing the diode 24*a* of the bistable circuit 10 only at the juncture of lines 51 and 58 quickly to charge the capacitive element 12 of this bistable circuit and render it operative. That is, the charge on the capacitive element 12 remains for a sufficient period of time and adds with the operating potential from transducer 54 ultimately to overcome the inherent turn-on time delay of the threshold switch means 14 rendering it conductive and causing the bistable circuit 10 to switch to its stable ON condition.

A reverse biasing source 32*a* is connected in series with the pulse generator $G_{12}$ for reverse biasing all the diodes along the pair of circuit lines 50 and 51 so that the alternating current operating potential applied thereto by transformer 54 will not cause conduction of the diodes to charge or discharge the capacitive elements 12 during periods of time when no address signal is applied thereto. The reverse biasing source 32*a* preferably has a voltage value which is sufficient to maintain the isolation diodes 24*a* in a reversed bias condition at all times except when an address pulse is applied thereto. Similarly, a reverse biasing source 32*b* is connected in series with the pulse generator $G_{11}$ and operates in substantially the same manner as the source 32*a* to prevent conduction of the diodes 24*a* of the bistable circuits 10 along the circuit lines 52 and 53. It will be understood that in some cases it may be desired to combine corresponding ones of the pairs of circuit lines 50–53 for connection to common circuit lines. That is, circuit lines 50 and 52 may be a common circuit line, or circuit lines 51 and 53 may be a common circuit lines.

The operation of the pulse generators $G_{11}$, $G_{12}$, $G_{21}$ and $G_{22}$ to forward bias the diodes 24a and charge or discharge the capacitive elements 12 in the same as described hereinabove with regard to FIG. 1.

Referring now to FIG. 6 there is seen an alternate form of an electroluminescent array which can be constructed in accordance with the principles of this invention. Here the bistable circuits 10, of FIG. 1, are electroluminescent circuits for energizing selected electroluminescent coated areas on a numerical display panel 60. The display panel 60 may include a transparent support surface such as glass or clear plastic upon which a conductive transparent coating 62, as for example tin oxide, is deposited to form a planar electrode surface. A plurality of electroluminescent coated areas 64, 65, 66, 67, 68, 69 and 70 are formed on the transparent conductive coating 62 to have the front surfaces thereof visible through the support surface of glass or plastic. The arrangement of electroluminescent coated areas shown in FIG. 6 is illustrated of means for forming any numeral between 1 and 0 by energizing the selected electroluminescent areas to emit light therefrom. Here the electroluminescent coated areas 64–70 act as the capacitive element 12 in each of the bistable circuits formed thereby. Each of the electroluminescent coated areas 64–70 is provided with an over-layer of conductive material (now shown) in registry therewith to be connected to associated ones of a plurality of circuit conductors 74–80, respectively, for connection to their associated threshold switch means 14 and isolation diode 24*a*. Each of the threshold switch means 14 is connected in series with its associated current limiting resistor, and operating potential is applied between the conductive transparent coating 62 and each of the resistors 16 via a pair of lines 82 and 84 which, in turn, are connected to a source 86 of alternating current voltage. The operating potential supplied by the alternating current voltage source 86 has a voltage value below the threshold voltage value of the threshold switch means 14, and, as such, none of the electroluminescent coated areas 64–70 will be energized to emit light therefrom.

A charging current voltage source 88 may be provided to forward bias selected ones of isolation diodes 24*a* to place a charge on its associated electroluminescent coated area. The charging current voltage source 88 has the positive terminal thereof connected to the transparent electrode surface 62 via the line 84 and the common line 84*a*, and the negative terminal of the charging current voltage source 88 is connected to a plurality of switch means 90, 91, 92, 93, 94, 95 and 96 via a line 97. The switch means 90-96 may be manually operated switch means but are desirably electronically operated switch means providing open and closed circuit conditions for selectively forward biasing the diodes 24*a* to place a charge on its associated electroluminescent coated area. Closure of switch means 94 and 96 will energize the electroluminescent coated areas 64 and 65 to emit light therefrom and represent the numeral 1. On the other hand, closure of switches 90, 92, 93, 95 and 96 will energize the electroluminescent elements 69, 67, 66, 70 and 64, respectively, to emit light therefrom and represent the reference numeral 2, and this can be accomplished for any numeral between 1 and 0. By a slightly different arrangement any one of the letters of the alphabet can be displayed in a similar manner. To display large numbers a plurality of display panels 60 are positioned one next to the other and a suitable decimal point may be provided at a selected location by enrgizing a small area of electroluminescent material in the same manner as disclosed herein.

Accordingly, address signal information can be rapidly applied to arrays of bistable circuits which have as their active switching elements switch means having inherent time delay characteristics which would otherwise require address signal information of relatively long duration. Also, this invention provides means whereby operating potential can be applied to a plurality of bistable circuits by independent lines while address signal information is applied to the bistable circuits by other lines.

It will be understood that modifications and variations of this invention may be effected without departing from the spirit and scope of the novel concepts disclosed herein.

I claim:

1. A multi-stable state circuit for operation between stable ON and OFF conditions while operating potential is continuously applied thereto, comprising: a capacitive energy storing circuit element; switch means having a time delay characteristic causing a delay between the time a switching potential is applied thereto and the time said switch means is actually rendered conductive, said switch means connected in circuit with said capacitive energy storing circuit element to form a multi-stable state circuit capable of operation between stable ON and stable OFF conditions with operating potential continuously applied thereto less than said switching potential; a start circuit connected in circuit with said capacitive energy storing circuit element and said switch means rapidly to apply an electric charge to said capacitive energy storing circuit element through a circuit bypassing said switch means, said charge remaining on said capacitive energy storing circuit element and combining with the operating potential to develop said switching potential for a period of time at least equal to the time delay of said switch means to initially render said switch means conductive and thereafter, said switch means alternately being rendered conductive and non-conductive at least in part by said operating potential to energize said capacitive energy storing circuit element.

2. The multi-stable state circuit of claim 1 wherein said switch means is a threshold switching device having an inherent turn-on time delay between the time a voltage equal to or greater than the threshold voltage value thereof is applied thereto and the time said threshold switching device is rendered conductive.

3. The multi-stable state circuit of claim 1 wherein there is provided means operable to rapidly discharge said capacitive energy storing element through a circuit bypassing said switching device to place the multi-stable state circuit in its stable OFF condition.

4. The multi-stable state circuit of claim 1 wherein said start circuit includes a diode which is normally non-conductive to isolate the start circuit from said capacitive energy storing element and is conductive when said electric charge is applied thereto.

5. The multi-stage state circuit of claim 4 further including means to reverse bias said diode while said operating potential is applied to said multi-stable state circuit, said reverse bias being rendered ineffectual rapidly to change the state of charge on said capacitive energy storing circuit element during applications of said electric charge.

6. The multi-stable state circuit of claim 1 wherein said capacitive energy storing circuit element and said switch means are connected in series and said start circuit is connected at the circuit juncture therebetween.

7. The multi-stable state circuit of claim 1 wherein said capacitive energy storing circuit element is a light emitting element which emits light therefrom when the multi-stable state circuit is in its stable ON condition.

8. The multi-stable state circuit of claim 1 wherein there is provided a light emitting element which emits light therefrom when the multi-stable state circuit is in its stable ON condition.

9. The multi-stable state circuit of claim 1 wherein said operating potential is a source of alternating current and said operating potential adds to the charge of said capacitive energy storing circuit element each operating half cycle after said electric charge fed by said start circuit initially operates the multi-stable state circuit.

10. The multi-stable state circuit of claim 1 wherein said start circuit rapidly applies an electrical charge to said capacitive energy storing circuit element in a period of time less then said time delay characteristic of said switch means.

* * * * *